United States Patent
Garcia

(10) Patent No.: US 7,288,727 B1
(45) Date of Patent: Oct. 30, 2007

(54) SHIELD FRAME FOR A RADIO FREQUENCY SHIELDING ASSEMBLY

(75) Inventor: Jorge L. Garcia, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/421,230

(22) Filed: May 31, 2006

(51) Int. Cl.
*H01R 4/00* (2006.01)
*H05K 9/00* (2006.01)

(52) U.S. Cl. .................. 174/369; 174/377; 174/387

(58) Field of Classification Search .............. 174/35 R, 174/35 GC, 350, 356, 358, 369, 377, 387; 361/800, 816, 818
See application file for complete search history.

(56) References Cited

U.S. PATENT DOCUMENTS

| | | | |
|---|---|---|---|
| 5,524,908 A * | 6/1996 | Reis | 277/654 |
| 5,566,055 A * | 10/1996 | Salvi, Jr. | 361/816 |
| 5,704,117 A * | 1/1998 | Mok et al. | 29/841 |
| 5,731,541 A * | 3/1998 | Bernd et al. | 174/387 |
| 6,121,545 A * | 9/2000 | Peng et al. | 174/377 |
| 6,271,465 B1 * | 8/2001 | Lacey | 174/358 |
| 6,275,683 B1 * | 8/2001 | Smith | 455/575.1 |
| 6,348,654 B1 * | 2/2002 | Zhang et al. | 174/362 |
| 6,613,976 B1 * | 9/2003 | Benn, Jr. | 174/358 |
| 6,624,432 B1 * | 9/2003 | Gabower et al. | 250/515.1 |
| 2003/0066672 A1 * | 4/2003 | Watchko et al. | 174/50 |

OTHER PUBLICATIONS

Chomerics—"EMI Shielding/Grounding Spacer Gaskets" pp. 1-3. □□□□(Note: This document was provided in parent case "U.S. Appl. No. 10/830,947" as prior art. Therefore, the date of this document is prior to Apr. 23, 2003).*

Chomerics—"Cho-Ver Shield Covers" pp. 1-2.□□□□(Note: This document was provided in parent case "U.S. Appl. No. 10/830,947" as prior art. Therefore, the date of this document is prior to Apr. 23, 2003).*

* cited by examiner

*Primary Examiner*—Hung V. Ngo
(74) *Attorney, Agent, or Firm*—Barbara R. Doutre

(57) ABSTRACT

A shield frame (800) is provided that allows for narrow width tracks to be used in a radio frequency (RF) shielding apparatus (900). The shield frame (800) is formed of a sheet metal frame (700) overmolded with a conductive elastomer (802) to form narrow edges (808, 810) that provide compliance in a +/−z-axis (814) directions while thicker portions of the overmolded conductive elastomer prevent buckling of the elastomer. The shield frame (800) can be sandwiched between two substrates (902, 908) of a communication device (900) having components (904) requiring RF shielding. Narrowing of the conductive elastomer overmold (802) allows ground tracks/runners (906) to be used on a substrate (902) which are narrower in width (912) than the shield frame width (702) thereby providing increased area for component placement.

13 Claims, 8 Drawing Sheets

SHIELD FRAME FOR A RADIO FREQUENCY SHIELDING ASSEMBLY

CROSS REFERENCE TO RELATED APPLICATIONS

This application is related to pending U.S. application Ser. No. 10/830,947, filed Apr. 23, 2004, by Garcia, entitled "Shield Frame for a Radio Frequency Shielding Assembly," and assigned to Motorola, Inc.

TECHNICAL FIELD

This invention relates in general to radio frequency (RF) shields and more particularly to RF shielding assemblies for electronic devices having size constraints.

BACKGROUND

As electronic devices continue to shrink, space on circuit boards becomes a critical consideration. Shielding takes up a significant portion of board space. Furthermore, the need for complete perimeter ground contact is an electrical necessity to provide sub-circuit isolation.

Traditional shielding approaches have used sheet metal cans soldered onto a board. The problem with the soldered-can approach is that considerable board space is required in the x-y planes, especially when using side by side solder tracks. A process known as pinch trimming can be used to eliminate the small lip around the can prior to the can being soldered to the board. While pinch trimming minimizes the required width of solder tracks, significant board space is still required when side by side cans are used. Traditional cans also take up space in the z-plane due to the sheet metal thickness and additional clearance gap needed between the sheet metal and board.

Several compliant conductive elastomer approaches are available as alternatives to solder cans. Dispensing beads onto a sheet metal can, metalized plastic or casting is one approach. However, dispensed beads have limited z-height causing compressive loads to be high. Another approach is to overmold a conductive elastomer directly over a sheet metal can, metalized plastic or casting. The overmolded can approach combines metal or metalized plastic cans with a conductive gasket overmolded directly to the can. The disadvantage to the overmolded can approach is that it is not z-space efficient particularly in stacked board assemblies in which one board is used to complete shielding via a ground plane.

A spacer gasket approach can be used to minimize z in stacked board assemblies where one board is completing the shield via a ground plane. In the spacer gasket approach a plastic gasket is first molded with a desired compartmentalization. Afterwards, a conductive elastomer is overmolded onto the side walls of each of the compartments in the plastic. Unfortunately, the spacer approach requires injection molding tools for both plastic and elastomer and is thus tooling intensive. Furthermore, because the elastomer is molded onto the sides of the plastic walls, large track widths (2 mm) are required thus making the spacer gasket approach impractical for miniaturized designs having tight board space requirements.

Accordingly, there is a need for an improved shield assembly. The ability to use a narrow width shield track would be particularly beneficial to communications products having tight space requirements.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
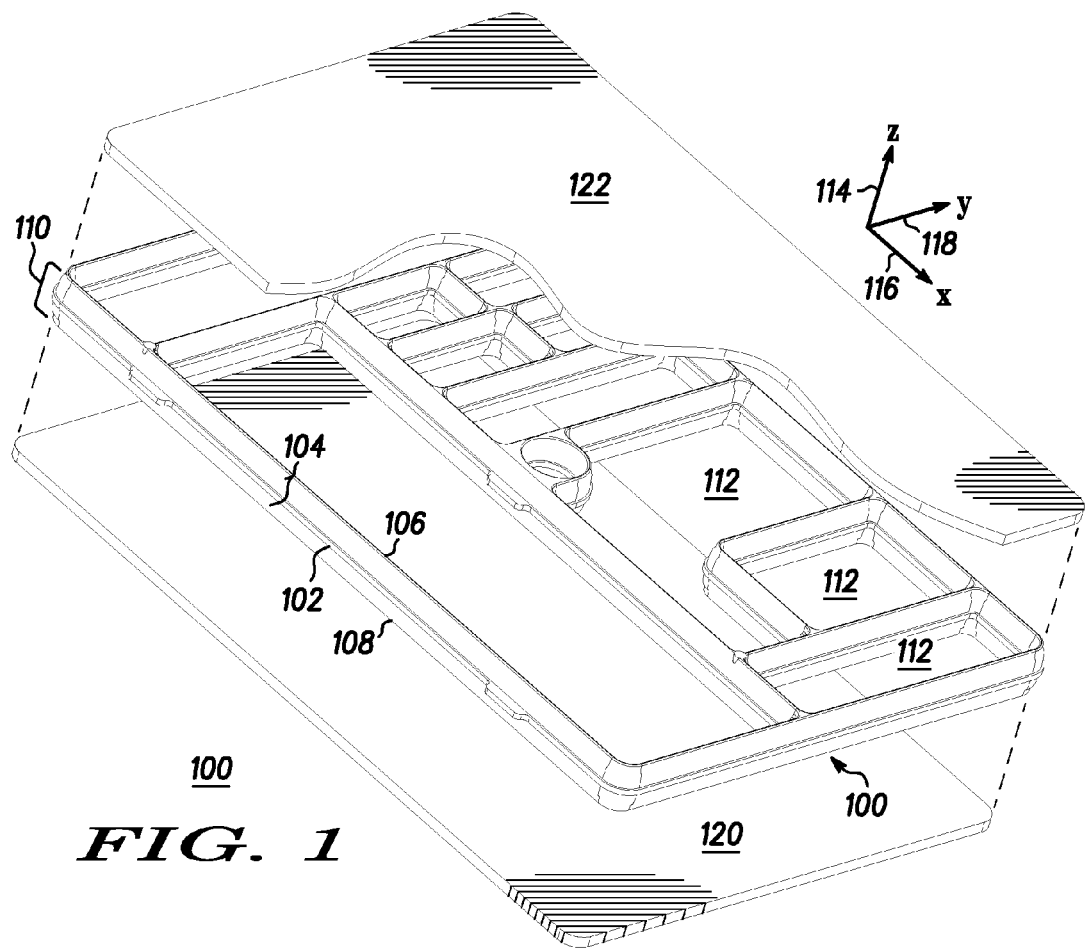
FIG. 1 is a shield frame in accordance with the present invention.

While the specification concludes with claims defining the features of the invention that are regarded as novel, it is believed that the invention will be better understood from a consideration of the following description in conjunction with the drawing figures, in which like reference numerals are carried forward.

In accordance with the present invention, there is disclosed herein a shield frame for use in a radio frequency (RF) shielding apparatus. The shield frame of the present invention comprises a sheet metal frame overmolded with a conductive elastomer to provide compliance in a z-axis direction and stiffness in x-axis and y-axis directions. The compliant nature of the frame provides optimum ground contact with a reduced shield track area and minimum clamping load.

Figure 2:
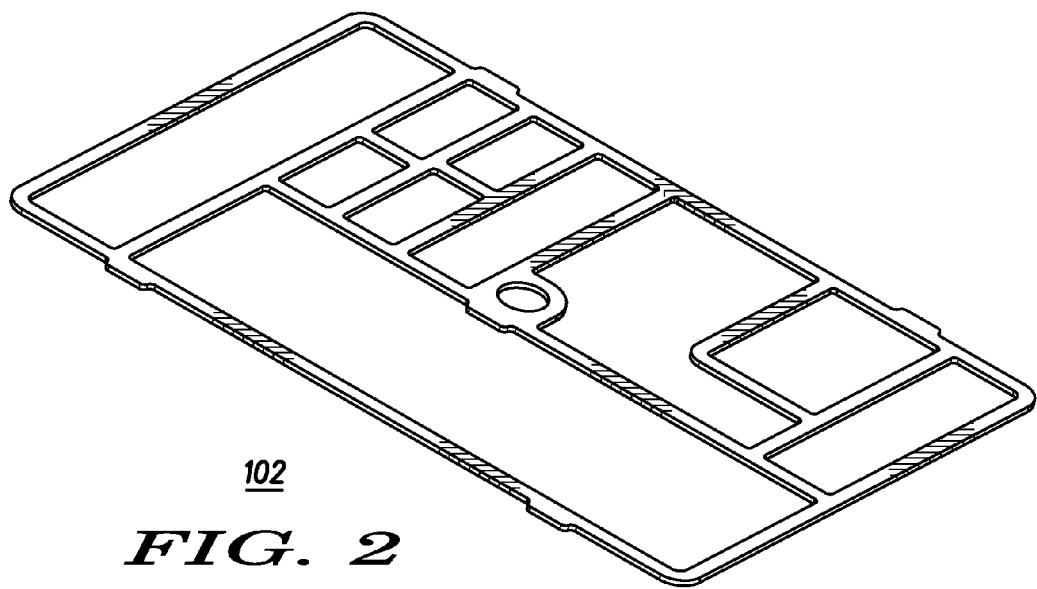
FIG. 2 is the sheet metal frame portion of the shield frame of FIG. 1 in accordance with the present invention.

FIG. 1 is a shield frame 100 in accordance with the present invention. The shield frame 100 is formed of a sheet metal frame 102, also shown separately in FIG. 2, having a conductive elastomer 104 overmolded thereon. The elastomer overmold 104 forms a first portion 106 of a wall 110 above the sheet metal frame 102 and a second portion 108 of the wall below the sheet metal frame. The shield frame 100 is compartmentalized 112 to provide various areas of isolation. Holes within the sheet metal frame 102 are preferably used, as will be discussed later, to ease the flow of material from one side of the sheet metal to the other during the overmold process as well as to facilitate adhesion of the overmold to the frame. The preferred construction of the walls is discussed and shown in more detail in conjunction with FIGS. 7, 8 and 9. The first and second portions 106, 108 of the wall 110 become compressibly coupled between first and second conductive substrates 120, 122 of a radio frequency (RF) shielding assembly. In accordance with the present invention, the wall 110 compressibly couples in the z-axis direction 114 but has stiffness in x-axis and y-axis directions 116, 118.

Figure 3:
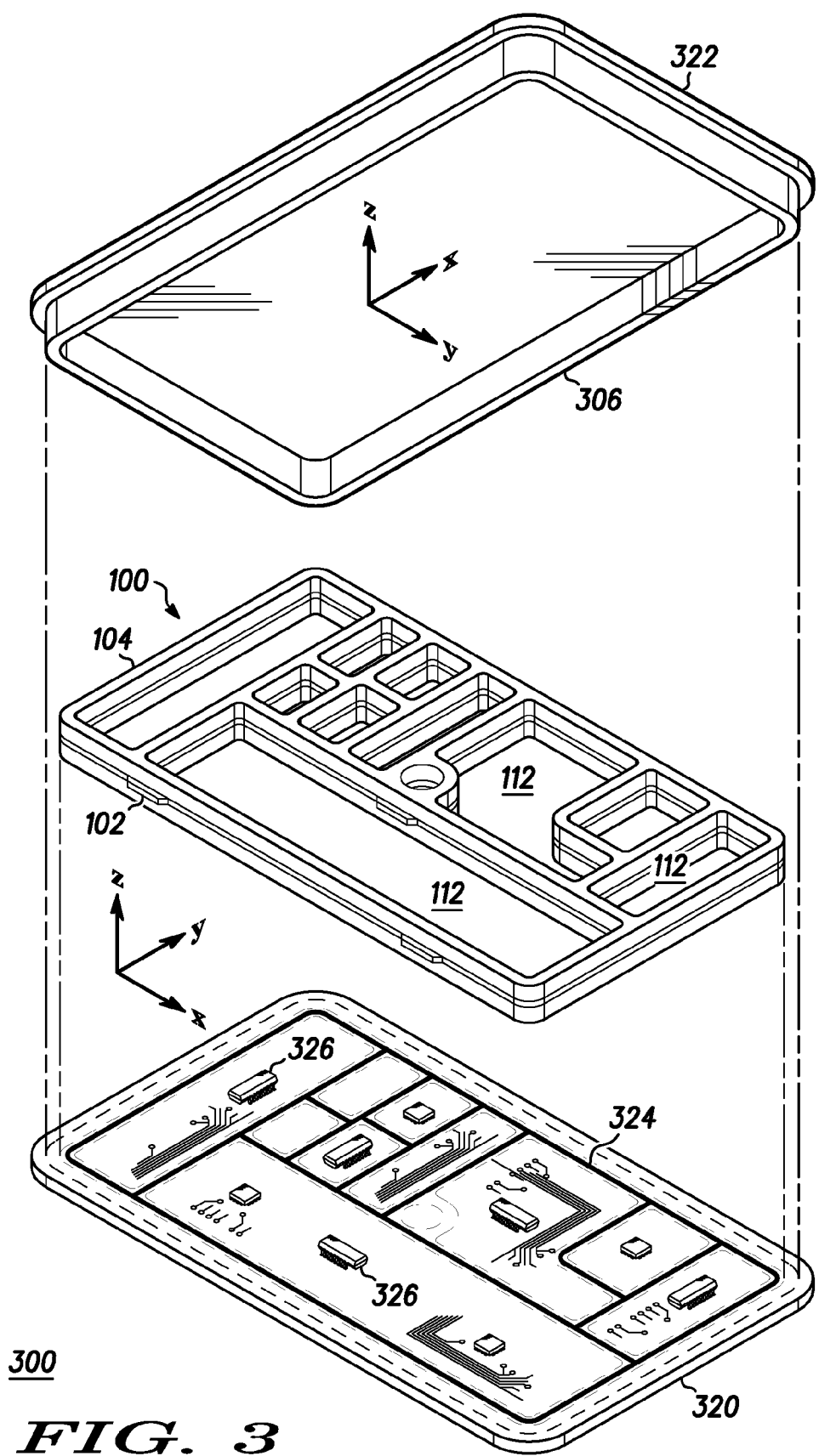
FIG. 3 is an exploded view of the shield frame being used in an assembly of a communication device in accordance with a first embodiment of the invention.

FIG. 3 is an exploded view of the shield frame 100 being used in an assembly of a communication device in accordance with a first embodiment 300 of the invention. In this first embodiment, the first substrate is a printed circuit board 320 and the second substrate is a metal casting 322 or metalized plastic. As in FIG. 1, the sheet metal frame is 102 overmolded with the conductive elastomer 104 and compartmentalized 112 to provide areas of isolation. The printed circuit board 320 includes a ground runner 324 and electrical components 326 disposed thereon in need of isolation. The ground runner 324 of printed circuit board 320 aligns with the compartments 112 of shield frame 100. The shield frame 100 of the present invention gets compressibly and electrically coupled between the ground runner 324 of the printed circuit board 320 and the metal casting 322, the casting thus forming the ground plane for the assembly. A compression stop device 306 is used to limit compression between printed circuit board 320 and the metal casting 322. In this first embodiment, the compression stop device 306 is integrally formed on the casting as a ledge for receiving the shield frame 100.

Figure 4:
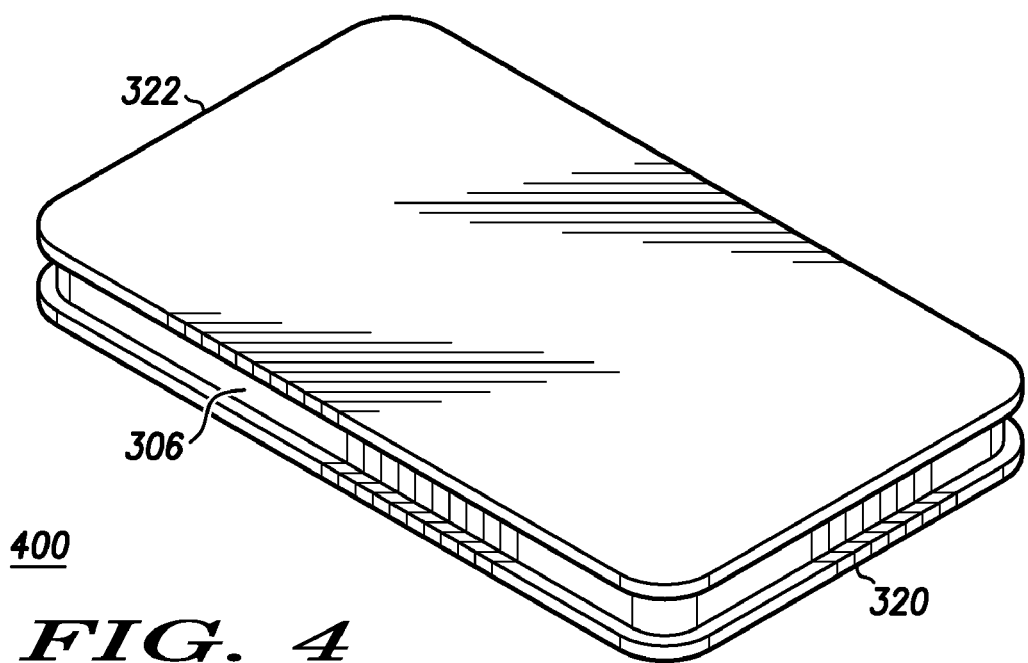
FIG. 4 is assembled view of FIG. 3 in accordance with the first embodiment of the invention.

FIG. 4 is an assembled view 400 of FIG. 3 in accordance with the first embodiment of the invention. The circuit board 320 and metal casting 322 are compressibly coupled together with the integral ledge of the casting providing the compression stop 306 therebetween. The overmolded elastomer 104 compresses in the z-axis direction along the sides of the ledge but retains stiffness in the x-axis and y-axis directions due to the stiffness of the sheet metal frame 102.

Assembly 300/400 provides RF isolation to the electronic components 326 within the open compartments 112 through the metal casting, compression stop 306 and ground runner 324. The shield frame 100 of the present invention can be formed of much thinner walls 110 than the walls of a traditional side by side shield cans. Thus, a thinner ground runner 324 can be used on the printed circuit board 320 as a shield track than was possible in past assemblies. For example, a 1.2 mm shield track can be used instead of the 2 mm track discussed previously. Additional details pertaining to the preferred wall construction is provided in conjunction with the description of FIGS. 7, 8 and 9.

Figure 5:
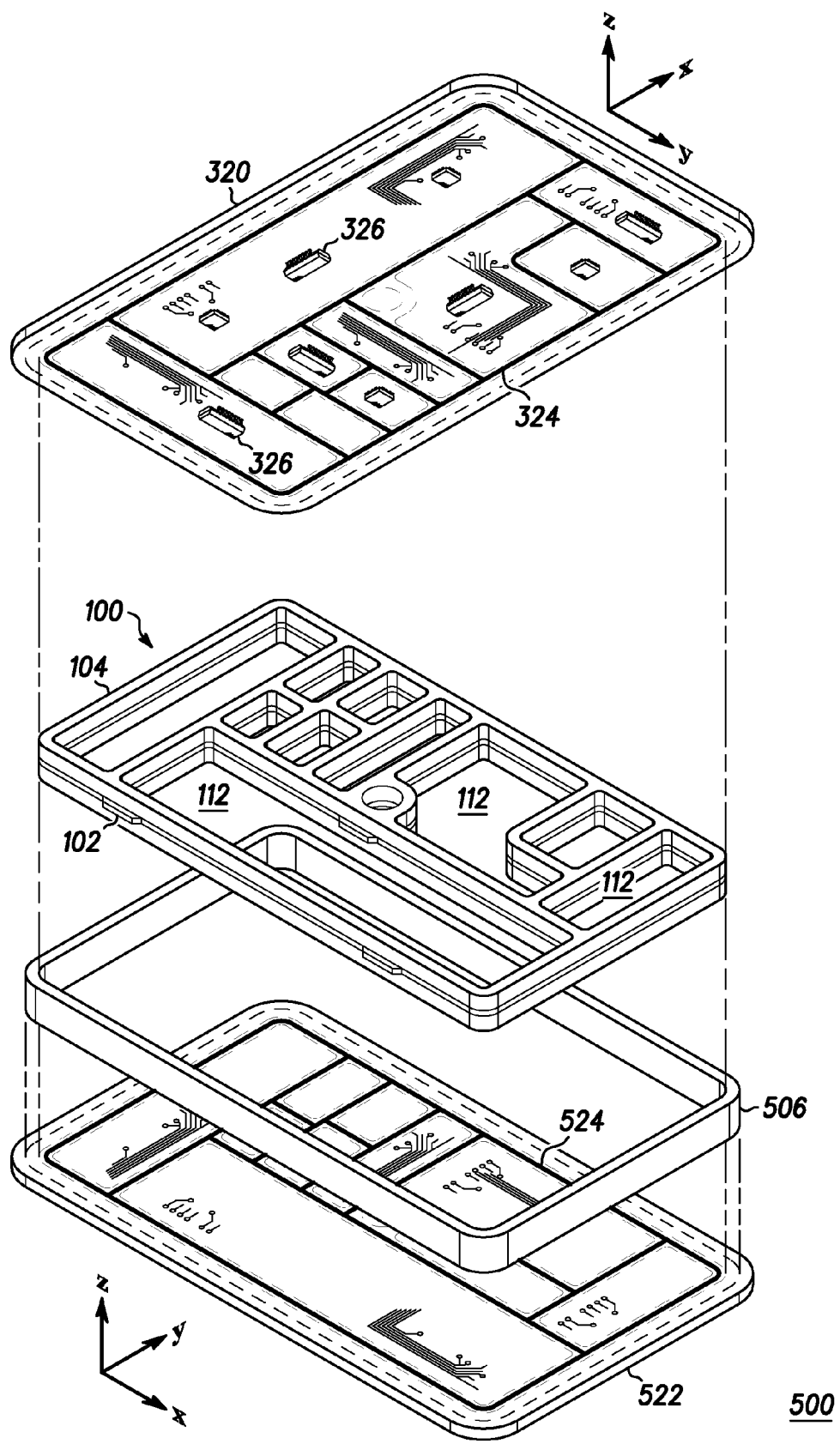
FIG. 5 is an exploded view of the shield frame being used in an assembly of a communication device in accordance with a second embodiment of the invention.

FIG. 5 is an exploded view of the shield frame 100 being used in an assembly of a communication device in accordance with a second embodiment 500 of the invention. In this second embodiment, the first and second substrates are both printed circuit boards 320, 522. The first circuit board 320, as in FIG. 3, comprises the ground runner 324 and electrical components 326 disposed thereon. The second printed circuit board 522 provides a ground plane and exposed ground runner 524. Ground runner 524 of printed circuit 522 aligns with compartments 112 of shield frame 100. Likewise, printed circuit board 320's ground runner aligns with compartments 112 of shield frame 100. When using the two board approach, a separate compression stop device 506, such as a plastic piece part, is used to limit compression the two boards 320, 522. The shield frame 100 is retained within the separate compression stop device 506. In accordance with the second embodiment, the shield frame 100 couples the ground runner 324 of the first board 320 to the ground plane of second board 522 through ground runner 524 and thus provides RF isolation to the electronic components 326 within the compartments 112.

Figure 6:
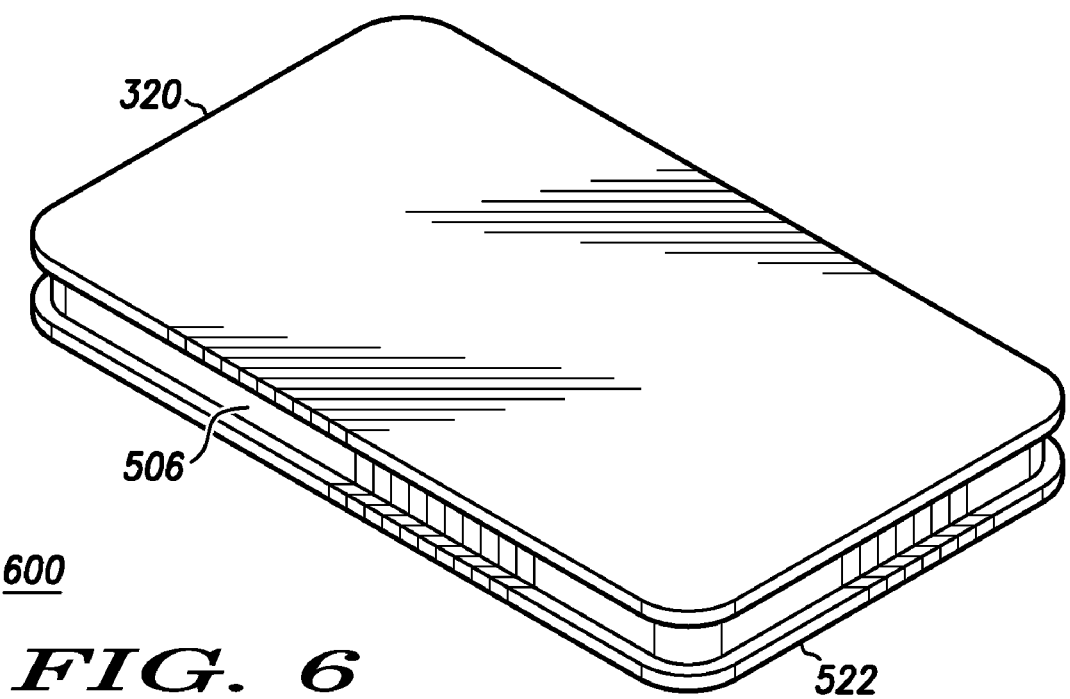
FIG. 6 is an assembled view of FIG. 5 in accordance with the second embodiment of the invention.

FIG. 6 is an assembled view 600 of FIG. 5 in accordance with the second embodiment of the invention. The two boards 320, 522 are compressibly and electrically together with the separate compression stop 506 therebetween. In accordance with the present invention, the overmolded elastomer 104 compresses in the z-axis direction between the two boards but retains stiffness in the x-axis and y-axis directions due to the stiffness of the sheet metal frame 102.

Assembly 500/600 provides RF isolation to the electronic components 326 within the open compartments 112 through the printed circuit board 522, compression stop device 506 and ground runner 324. Again, the shield frame 100 allows for a thinner ground runner 324 to be used on the printed circuit board 320 thereby facilitating tight space constraints.

There are advantages to using the first embodiment shielding assembly approach having the metal casting in that a plurality of circuit boards each having different areas in need of isolation can be accommodated with a single metal casting. By providing a plurality of overmolded sheet metal frames each having different areas of compartmentalization that align with the different areas in need of isolation, a single metal casting can be used to interchangeably couple each of the plurality of overmolded sheet metal frames to each of the plurality of circuit boards with which each aligns. Each of the plurality of overmolded sheet metal frames can be interchanged within the integrally formed ledge of the metal casting. Thus, the use of the overmolded sheet metal frame of the present invention allows for one single metal casting to be used in conjunction with different circuit board layouts. By not having to compartmentalize the metal casting, the same metal casting can be used for multiple assemblies thereby reducing cost.

Figure 7:
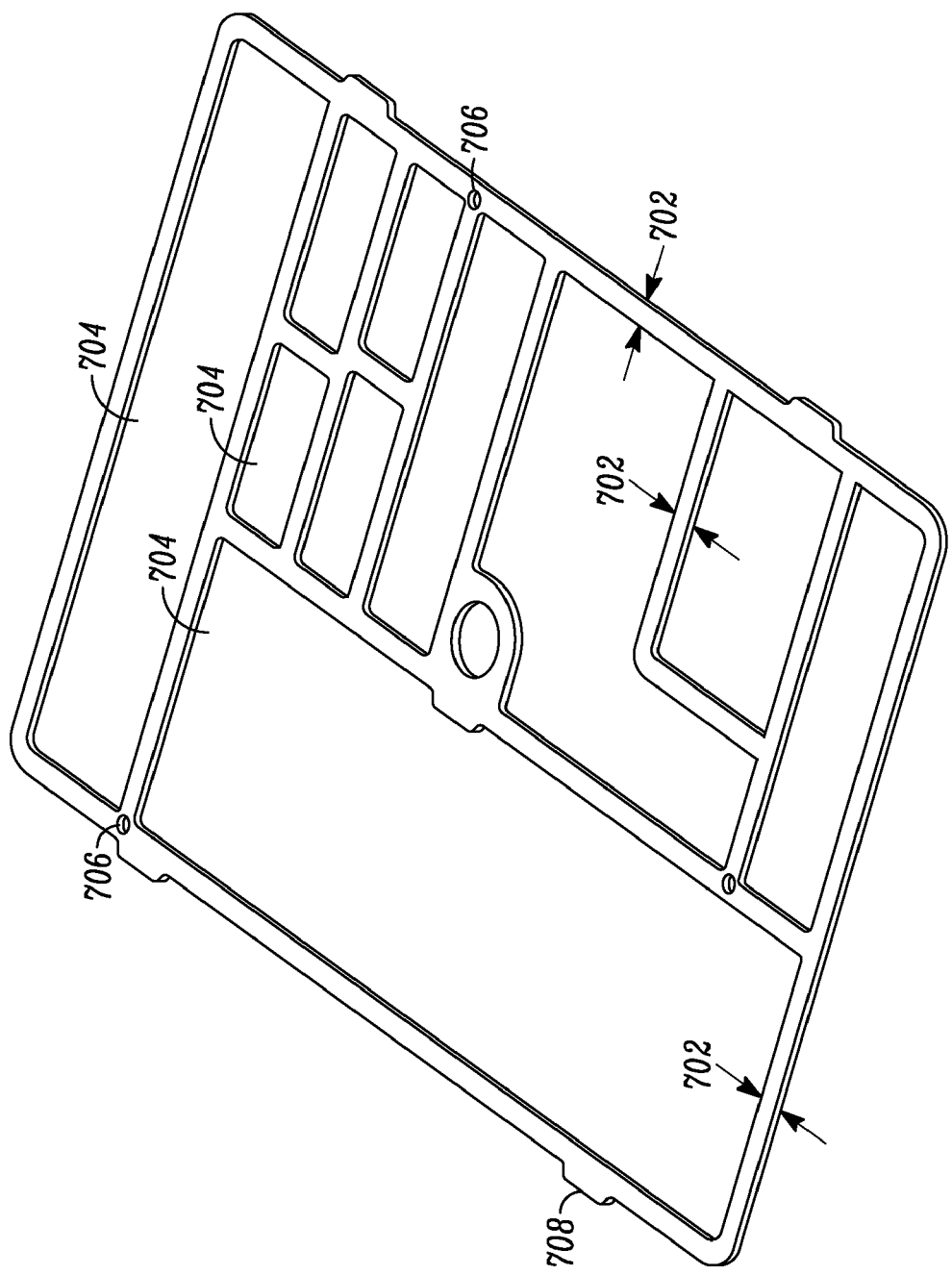
FIGS. 7, 8, and 9 provide additional views of a sheet metal frame (FIG. 7) with conductive elastomer overmolded thereon (FIG. 8) for use in shielding components of a communication device (FIG. 9) in accordance with an embodiment of the invention.
Figure 8:
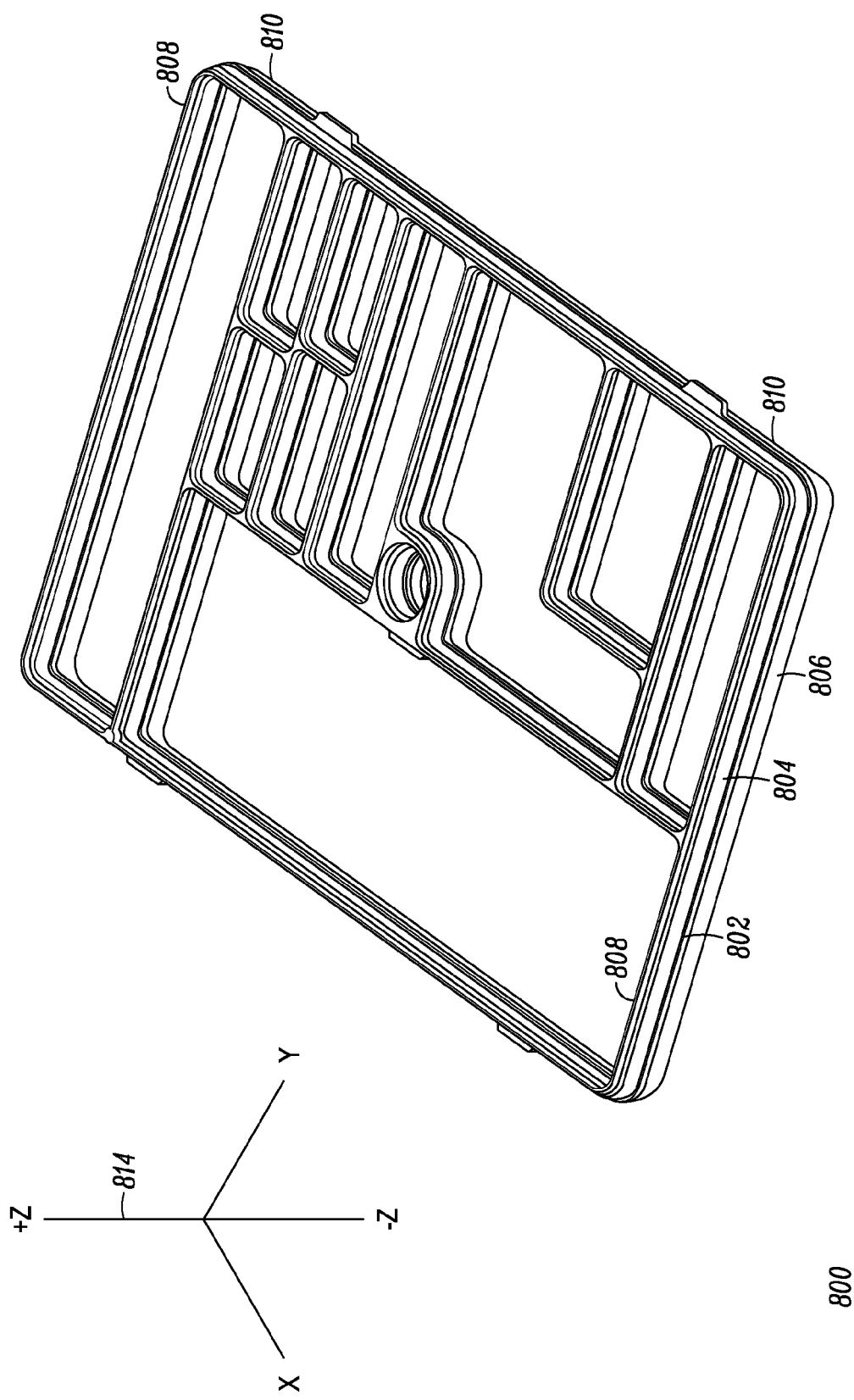
Figure 9:
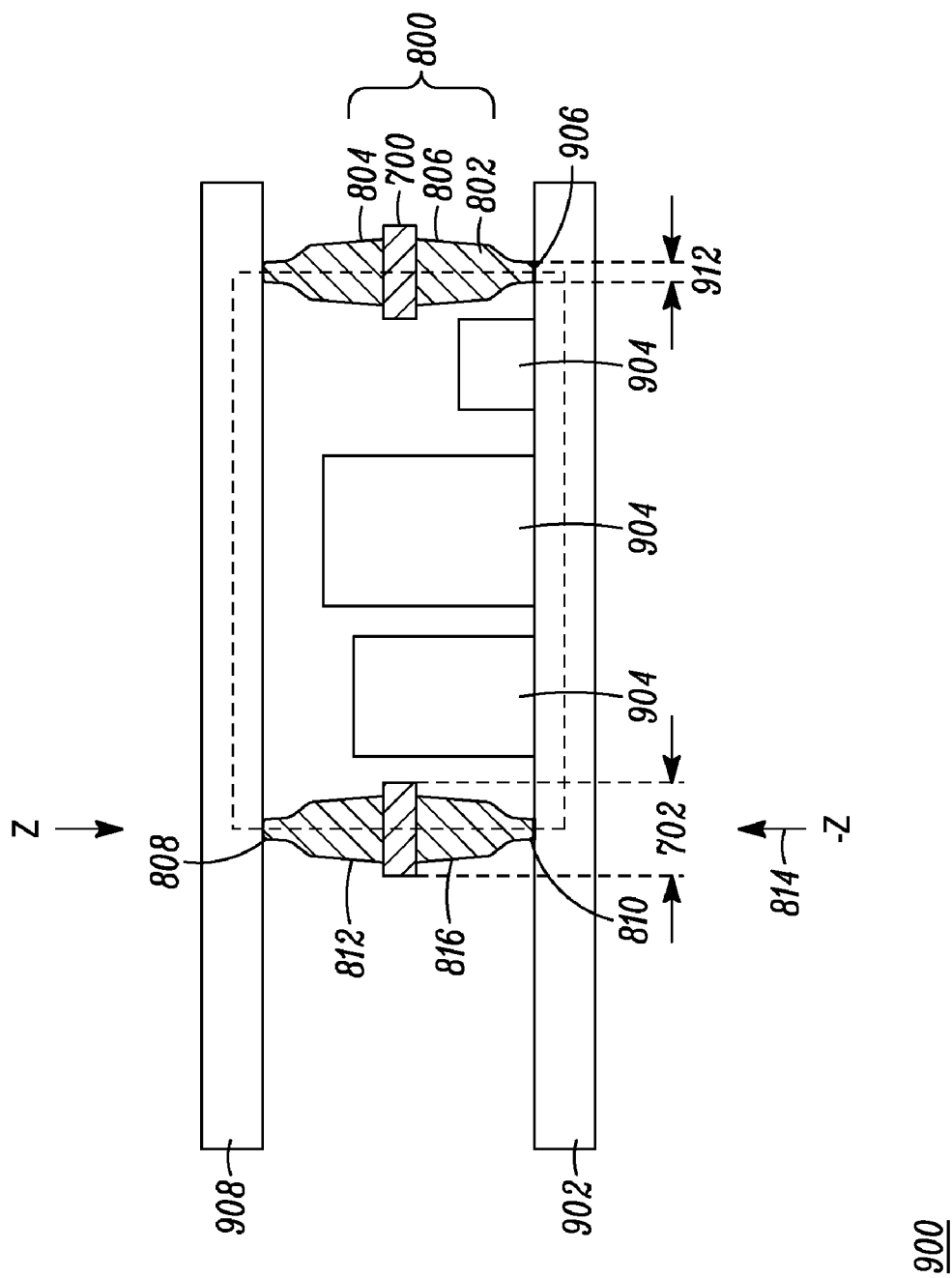

FIGS. 7, 8, and 9 provide additional details of a sheet metal frame 700 with conductive elastomer overmolded thereon 800 for use in shielding components of a communication device 900 in accordance with a preferred embodiment of the invention.

FIG. 7 shows flat sheet metal frame 700 having a predetermined track width 702, the sheet metal frame forming compartmentalized areas 704. In accordance with this embodiment, metal frame 700 includes at least one thru-hole 706 to facilitate overmolding of a conductive elastomer and to mechanically interlock both sides of the conductive elastomer to the sheet metal frame as shown in FIG. 8. Sheet metal frame 700 also preferably includes blades 708 which provide a means for ejecting the frame from a mold (not shown) after overmolding of the conductive elastomer.

FIG. 8 shows conductive elastomer 802 overmolded to the compartmentalized sheet metal frame 700 so as to form an upper wall 804 above the compartmentalized sheet metal frame and a lower wall 806 below the compartmentalized sheet metal frame. In accordance with the preferred embodiment, the conductive elastomer overmold 802 narrows in thickness in the +/−z-axis directions (z-height) 814 to form first and second edges 808, 810 which are thinner than the predetermined width 702 of the frame 700. These narrow edges 808, 810 allow for narrower shield tracks to be used on a substrate thereby providing more real estate for component placement. The narrow edges 808, 810 also provide the compliance in a +/−z-axis directions while thicker portions 812, 816 of the walls 804, 806 prevent buckling thereby assuring solid contact of the narrow edges on the shield tracks.

The overmolded sheet metal frame 800 provides a shield frame of compartmentalized areas for RF shielding of electronic components in communication device 900, as seen in FIG. 9. First substrate 902, shown here as a printed circuit board, includes a plurality of electronic components 904 disposed thereon and shield tracks in the form of ground runners 906 surrounding the electronic components. A second substrate 908, such as a casting or a printed circuit board with ground runners provides a ground plane. Communication device 900 includes shield frame 800 compressibly coupled between the two substrates 902, 908. The overmolded sheet metal frame 800 is compressibly and electrically coupled between the ground track 906 of the first substrate 902 and the ground plane of the second substrate 908. As seen in this view, ground track 906 has a narrower width 912 than the predetermined width 702 of the sheet metal frame 700. The second substrate 908 in this view is shown as a casting but could also include shield tracks having a narrower width than the predetermined width 702 of the sheet metal frame 700. The lower wall's narrow edges 810 align with narrow shield tracks 906 while the narrow edge 808 of upper wall portion 804 couples to second substrate 908. The narrow wall portions 808, 810 are compressed in the +/−z-axis directions while the thicker wall portions 812, 816 prevent buckling of the elastomer. Stiffness in x and y directions is provided by the sheet metal.

Accordingly, there has been provided a shield frame that provides for an improved shield assembly. Overmolding of the conductive elastomer to the sheet metal frame so as to provide walls with narrow edges allows for increased compliance and compressibility of the overmolded frame between substrates as well as the ability to use narrower ground tracks on these substrates thereby providing increased area for component placement. The compartmentalization of the shield frame eliminates the need for separate solder cans and further facilitates miniaturization. The metal casting or metalized plastic need not be tooled for separate compartments thereby reducing tooling costs if only one area requires shielding. The shield frame compartments can be formed for a variety of circuit layouts while still using the same casting which provides significant design flexibility.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A shielding assembly, comprising:
    a flat sheet metal frame having open compartmentalized areas;
    first and second substrates, the first substrate providing an electrical ground runner and the second substrate providing a ground plane, the electrical ground runner being narrower than the width of the flat sheet metal frame; and
    a conductive elastomer overmolded to the sheet metal frame so as to form upper and lower portions of a wall, the conductive elastomer being compressibly coupled between the first and second substrates such that the upper portion of the wall electrically couples to the ground plane and the lower portion of the wall electrically couples to the ground runner, the lower portion of the wall narrowing in thickness so as to align with the narrow width of the electrical ground runner.

2. The shielding assembly of claim 1, wherein the second substrate comprises a metal casting.

3. The shielding assembly of claim 1, wherein the second substrate comprises a printed circuit board having a ground plane.

4. A shield frame for use in a radio frequency (RF) shielding apparatus, comprising:
    a compartmentalized sheet metal frame having a predetermined width;
    first and second substrates having first and second shield tracks, the first and second shield tracks having a narrower width than the predetermined width of the compartmentalized sheet metal frame; and
    a conductive elastomer overmolded to the compartmentalized sheet metal frame so as to form an upper wall above the compartmentalized sheet metal frame and a lower wall below the compartmentalized sheet metal frame, the upper and lower walls for compressibly coupling between first and second shield tracks of the first and second conductive substrates, the upper and lower walls narrowing in thickness so as to align with the first and second shield tracks.

5. The shield frame of claim 4, wherein the upper and lower walls compressibly couple in +/−z-axis directions but provide stiffness in x-axis and y-axis directions.

6. The shield frame of claim 4, wherein the first substrate comprises a printed circuit board and the second substrate comprises a printed circuit board.

7. The shield frame of claim 4, wherein the first substrate comprises a printed circuit board and the second substrate comprises metalized plastic.

8. The shield frame of claim 4, wherein the compartmentalized sheet metal frame includes at least one through hole to facilitate overmolding of the conductive elastomer and to mechanically interlock both sides of the conductive elastomer to the compartmentalized sheet metal frame.

9. A communication device, comprising:
    a first substrate having electronic components disposed thereon and ground runners surrounding a plurality of electronic components;
    a second substrate providing a ground plane; and
    a sheet metal frame having a wider track width than the ground runners of the first substrate, the sheet metal frame overmolded with a conductive elastomer which narrows so as to align with the ground runners, the sheet metal frame being compressibly and electrically coupled between the ground runners of the first substrate and the ground plane of the second substrate.

10. The communication device of claim 9, wherein the sheet metal frame is compartmentalized to shield various groups of the plurality of electronic components.

11. The communication device of claim 9, wherein the first and second substrates are printed circuit boards.

12. The communication device of claim 9, wherein the first substrate is a printed circuit board and the second substrate is a metal casting.

13. The communication device of claim 9, wherein the sheet metal frame overmolded with a conductive elastomer provides compliance in a +/−z-axis directions and stiffness in x-axis and y-axis directions.

* * * * *